United States Patent [19]

Aitchison

[11] Patent Number: 4,845,440
[45] Date of Patent: Jul. 4, 1989

[54] DISTRIBUTED AMPLIFIER CIRCUITS

[75] Inventor: Colin S. Aitchison, Surrey, England

[73] Assignee: National Research Development Corporation, London, United Kingdom

[21] Appl. No.: 174,346

[22] Filed: Mar. 28, 1988

[30] Foreign Application Priority Data

Mar. 30, 1987 [GB] United Kingdom ............ 8707508

[51] Int. Cl.$^4$ ...................... H03F 3/16; H03F 3/60
[52] U.S. Cl. .................................. 330/277; 330/286
[58] Field of Search .............. 330/53, 54, 57, 277, 330/286; 333/109, 117

[56] References Cited

U.S. PATENT DOCUMENTS 4,532,480 7/1985 Gerard ...................... 330/277 X

FOREIGN PATENT DOCUMENTS 0613483 6/1978 U.S.S.R. .................... 330/286

Primary Examiner—Steven Mottola
Attorney, Agent, or Firm—Larson and Taylor

[57] ABSTRACT

A wide band amplifier for operation at very high frequencies, for example in the 20 MHz to 50 GHz range comprises a MESFET distributed amplifier (22) having a gate and a drain transmission line, a first hybrid circuit (18) to apply a first and second input signal to opposite ends of the gate transmission line, and a second hybrid circuit (26) connected to opposite ends of the drain transmission line to receive and combine first and second output signals from the drain transmission line to provide an amplified output signal. The use of two input signals travelling in opposite directions along the gate transmission line increases the gain which can be achieved in the distributed amplifier and reduces the noise component of the output signal. It is particularly useful for enhancing the performance of a distributed amplifier containing only a few MESFETs.

22 Claims, 4 Drawing Sheets

— CONVENTIONAL D.A.
--- INVENTION

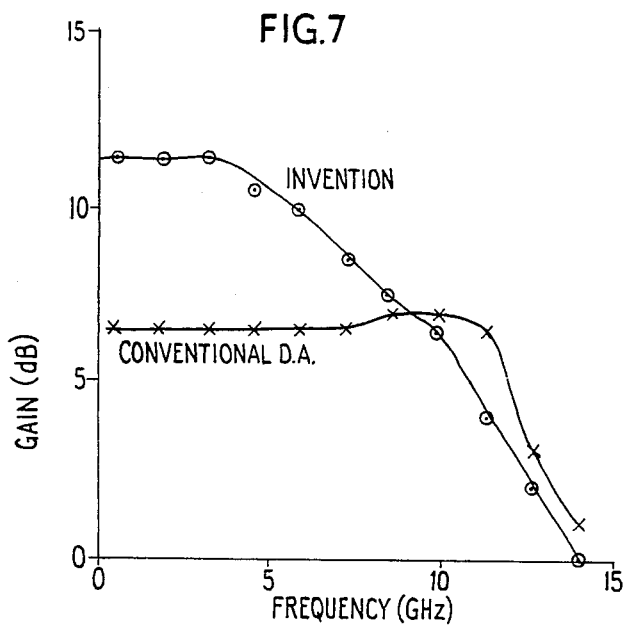
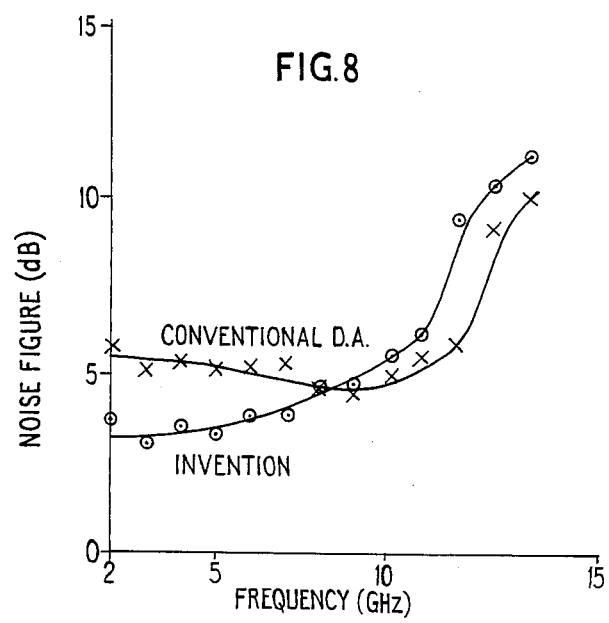

DISTRIBUTED AMPLIFIER CIRCUITS

BACKGROUND OF THE INVENTION

This invention relates to distributed amplifier circuits for operation at very high frequencies, for example in the 20 MHz to 50 GHz range.

Distributed amplifiers can achieve a very wide bandwidth, because they do not involve the use of resonant circuits. Such amplifiers comprise one or more field effect transistors connected between two microwave transmission lines; a "gate" transmission line to which the gate electrodes of the transistors are connected, and a "drain" transmission line to which the drain electrodes are connected. The source electrodes of the transistors are connected to a "ground" line, which is common to the two transmission lines and to a microwave signal input and a microwave signal output. The gate and drain transmission lines are essentially artificial lumped transmission lines with inductors provided in the end sections of the lines and between electrodes of successive transistors. The transistors are preferably GaAs MESFETs.

In use of the amplifier, a microwave signal is fed into the microwave signal input and a respective travelling wave passes along each of the gate and drain transmission lines. The travelling waves are amplified by the or each transistor in turn and with the phase constants of the lines equal and correctly defined the gain of the amplifier is substantially independent of the signal frequency. Typically a gain of some 6 dB can be obtained over a very wide frequency band.

Whilst high gain and large bandwidth are the basic requirements of a distributed amplifier, it is also very important that the "noise figure" or increase in noise generated by the amplifier is kept as low as possible.

A detailed analysis of these noise components generated in a distributed amplifier is given in a paper by the present inventor, published in IEEE Transactions on Microwave Theory and Techniques, Vol. MTT-33, No. 6, June 1985, pages 460–466, entitled "The Intrinsic Noise Figure of the MESFET Distributed Amplifier".

SUMMARY OF THE INVENTION

According to one aspect of this invention a method of operating a MESFET distributed amplifier comprises feeding a first input signal to one end of the gate transmission line, feeding a second input signal substantially identical to the first input signal to the other end of the gate transmission line, taking a first output signal from one end of the drain transmission line and a second output signal from the other end of the drain transmission line, and combining the first and second output signals to produce an amplified output signal.

According to another aspect of this invention a wideband amplifier circuit, comprises a MESFET distributed amplifier having a gate and a drain transmission line, means to apply a first input signal to one end of the gate transmission line and to apply a second input signal substantially identical to the first input signal to the other end of the gate transmission line and means to receive a first output signal from one end of the drain transmission line and a second output signal from the other end of the drain transmission line and to combine these signals to provide an amplified output signal.

Preferably the means to apply the first and second input signals and the means to receive, and combine the first and second output signals comprise corresponding hybrid circuits. Hybrid circuits are well-known devices in the microwave field and are four port devices with two input ports and two output ports. A signal fed into one of the input ports appears as two identical signals at both output ports and a signal fed to the other input port appears as signals at both output ports that are identical but shifted in phase relative to one another. Equally, if input signals are fed to both input ports they are combined by the device and the combined signal appears at the output port. Hybrid circuits are usually 90° or 180° hybrids, with a 90° hybrid the output signals are in phase or are phase shifted by 90° or 270° relative to one another, and with a 180° hybrid the output signals are in phase or are phase shifted by 180° relative to one another. When 90° hybrid circuits are used to combine two input signals a maximum output is obtained from one output port when the input signals are in-phase and a maximum output is obtained from the other output port when the input signals are 90° or 270° out of phase. Similarly when 180° hybrid circuits are used to combine two input signals, a maximum output is obtained from one output port when the input signals are in-phase and a maximum output is obtained from the other output port when the input signals are 180° out of phase. With this invention only three of the ports of each hybrid are used and the fourth port, the isolated port, is terminated by an impedance which matches the characteristic impedance of the hybrid circuit.

Although 90° and 180° hybrids are proposed above, other means for providing two input signals might alternatively be used, together with means for combining the output signals from the amplifier to provide the final output. For example, the input signal source might comprise two oscillators locked together to give two signals at the same frequency and in-phase or at the required phase difference.

With a distributed amplifier operating under linear conditions it is symmetrical in operation so that a signal introduced into the one end of the gate transmission line is amplified as it travels forward towards the other end of the line; and a signal introduced into the other end of the gate transmission line is amplified as it travels forward towards the one end of the line. In addition to this signals also travel in the reverse directions along the gate transmission line and then via the drain line to the output. The signals travelling in both the forward and reverse directions from both the one end to the other and vice versa add vectorally to provide the amplified output of the amplifier. By selecting the correct phase relationship between the first and second input signals the output of the amplifier is maximized. This results in a considerable increase in the available gain of a distributed amplifier in comparison with its conventional mode of operation.

Good results can be obtained with the signals applied to the two ends of the gate transmission line in-phase or out of phase by 90°, 180° or 270°. When the signals applied to the opposite ends of the gate transmission line are out of phase a corresponding phase change must be introduced between the output signals from opposite ends of the drain transmission line. The means to apply the first and second input signals to opposite ends of the gate transmission line may include means to phase-shift the signals relative to one another and, in this case, the means to receive and combine the first and second output signals from the opposite ends of the drain transmission line may include means to introduce a corresponding phase-shift between the first and second output signals.

Further there are benefits in the noise figure since some of the noise components of the signals travelling in the forwards and reverse directions from one end to the other of the line and vice versa appear in antiphase at the output and therefore cancel one another out so giving a lower noise figure for the amplifier. In addition, since the available gain of the amplifier is increased the overall noise figure or signal to noise ratio for the amplifier is increased still further.

BRIEF DESCRIPTION OF THE DRAWINGS

Examples of the invention will now be described, and contrasted with a conventional distributed amplifier with reference to the accompanying drawings, in which:

FIG. 7 is a graph of gain against frequency illustrating the comparison of an example of a double stage distributed amplifier in accordance with the invention with a conventional device; and, FIG. 8 is a graph of noise figure against frequency illustrating the comparison of an example of a double stage distributed amplifier in accordance with this invention with a conventional device.

DESCRIPTION OF PREFERRED EXAMPLES

Figure 1:
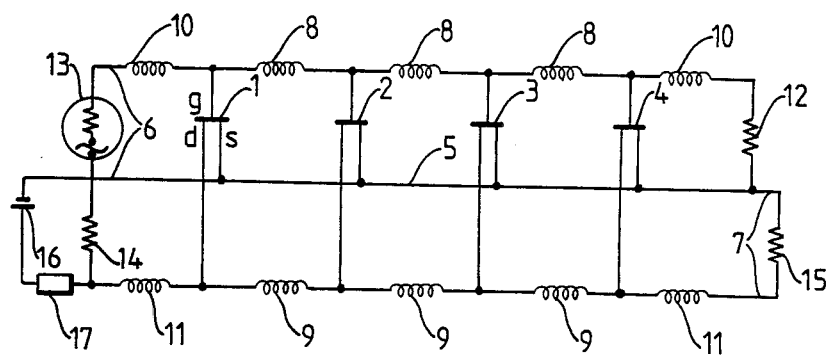
FIG. 1 is a circuit diagram of a conventional, i.e. prior art, distributed amplifier.

A distributed amplifier comprises a number of field effect transistors 1 to 4 connected as shown schematically in FIG. 1. The transistors are preferably GaAs MESFETS and the amplifier may include any desired number of these transistors. The amplifier basically comprises two microwave transmission lines; a "gate" transmission line in which the gate electrodes of the transistors 1 to 4 are connected, and a "drain" transmission line in which the drain electrodes are connected. The source electrodes are connected to a "ground" line 5, which is common to the two transmission lines and to a microwave signal input 6 and a microwave signal output 7. The gate electrodes of successive transistors are interconnected via inductors 8, and the drain electrodes are interconnected by similar inductors 9. Inductors 10 and 11 are provided in the end sections of the lines.

The gate transmission line is terminated at its right-hand end (as viewed in FIG. 1) by a resistor 12 equal to the characteristic impedance of the line, which may be, for example, 50Ω. The resistor 12 may be referred to as the "idling gate load". The microwave signal is fed into the input 6 from a generator 13 of impedance equal to that characteristic impedance. The drain transmission line is terminated at its left-hand end by a resistor 14 equal to the characteristic impedance of that line, again 50Ω, for example. The resistor 14 may be referred to as the "idling drain load". The signal output 7 is connected to a load 15, which has an input impedance equal to the characteristic impedance of the drain transmission line. A d.c. source 16 is connected to the line 5, and is connected to the junction of the resistor 14 and the adjacent inductor 11, via a low-pass filter 17, to provide bias for the drain electrodes.

In use of the amplifier, a microwave signal fed into the input 6 is amplified by the successive transistors 1 to 4. A respective travelling wave passes along each of the gate and drain transmission lines, and with the phase constants of both lines equal and correctly determined the gain of the amplifier is substantially independent of the signal frequency. A gain of some 6 dB can be obtained over a very wide frequency band.

Figure 2:
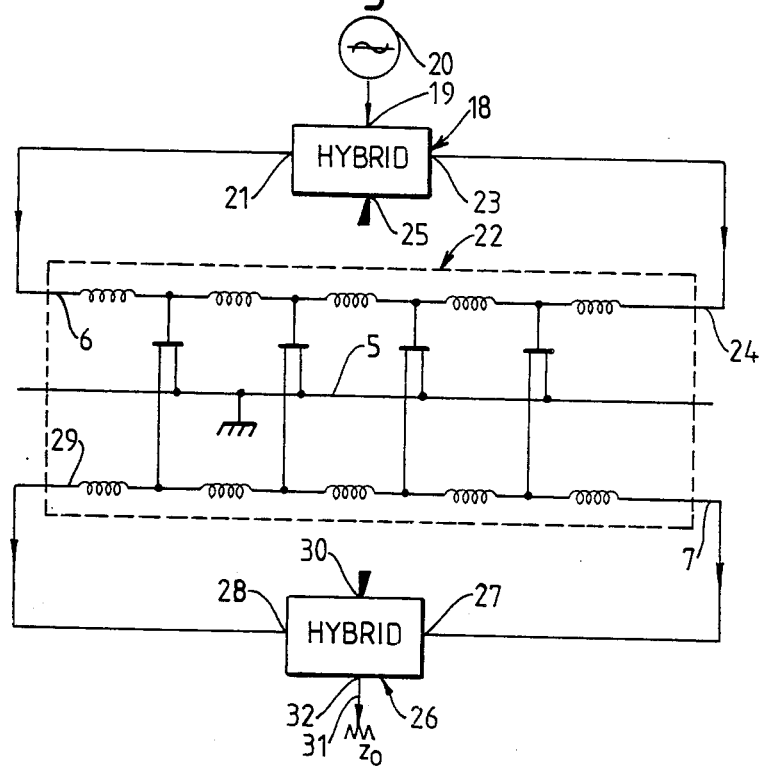
FIG. 2 is a block schematic diagram of a distributed amplifier circuit in accordance with this invention.

Referring to FIG. 2, a distributed amplifier circuit in accordance with the invention comprises a hybrid 18 to an input port 19 of which is fed a high-frequency input signal from a source 20. A first output port 21 of the hybrid is connected to the normal input 6 of a distributed amplifier 22 of the kind described above with reference to FIG. 1. A second output port 23 of the hybrid is connected to the right hand end 24 of the gate line of the amplifier 22. The isolated port 25 of the hybrid is terminated by an impedance equal to the characteristic impedance of the hybrid 18. The characteristic impedance of the hybrid 18 is matched, as closely as possible to that of the gate line, so that the hybrid effectively provides the correct source impedance at the input 6, and the correct gate idling load, equivalent to the resistor 12 of FIG. 1, at the end 24 of the gate line. The characteristic impedance of a hybrid is, in practice, frequency dependent whereas the impedance of the gate line, being an artificial transmission line is arranged to be frequency independent. To improve the impedance match the gate line may be coupled to the hybrid 18 via m derived sections which are well known in the microwave field and which translate the impedance of the hybrid 18 as it appears to the gate line into a frequency independent impedance.

A second hybrid 26 is connected to the drain line. Thus, an output port 27 of the hybrid 26 is connected to the output 7 of the amplifier 22, and the other output port 28 of the hybrid is connected to the left-hand end 29 of the drain line. The isolated port 30 of the hybrid is terminated by an impedance equal to the characteristic impedance of the hybrid 26 and, again, the characteristic impedance of the hybrid 26 is matched as closely as possible to that of the drain line, so that the hybrid effectively provides the correct load impedance at the output 7, and the correct drain idling load, equivalent to the resistor 14 of FIG. 1, at the end 29 of the drain line. Again the match may be improved by the use of m derived sections. An output line 31, terminated by the characteristic impedance, is connected to the output port 32 of the hybrid. The ground lines of the input and output ports of the hybrids are all connected to the ground line 5 which interconnects the sources of the MESFETs in the amplifier 22.

The hybrids 18 and 26 may be both 90° hybrids or both 180° hybrids.

In operation of the circuit, an input signal is fed to the port 19, and the hybrid 18 feeds out signals at the ports 21 and 23 which are in-phase or are mutually phase-displaced by 90°, 180° or 270° depending upon the type of hybrid and the ports used. Resultant signals are received at the input ports 27 and 28 of the hybrid 26, and those signals are correspondingly not phase-displaced or are phase-displaced by 90°, 180° or 270° and are combined within the hybrid into a composite signal which is fed out to the line 31.

The action by which the signals fed to the input ports 27 and 28 are produced in the amplifier 22 is as follows. Since the amplifier is constructed of MESFETs, it is symmetrical in operation, i.e. a signal fed in at the right-hand end 24 of the gate line is amplified and passed out at the left-hand end 29 of the drain line in exactly the same way as a signal fed into the left-hand end of the gate line (i.e. at the input 6) is amplified and passed out at the right-hand end of the drain line (i.e. at the output 7). Furthermore, as the signal applied to the input 6 reaches each successive MESFET and is amplified thereby, part of the resultant signal is transmitted towards the output 7 through the drain line, and part is transmitted towards the left-hand end 29 of the drain line. Similarly, as the signal applied to the right-hand end 24 of the gate line reaches each successive MESFET and is amplified thereby, part of the resultant signal is transmitted leftwards along the drain line towards the end 29, and part is transmitted towards the output 7. The signals fed to the ports 27 and 28 are therefore both derived by virtue of both forward gain and reverse gain in the amplifier.

The result of the phase-shifting of the input signals, the corresponding phase-shifting and combination of the output signals and the forward and reverse amplification in the amplifier 22 is a reduction in the total noise present in the output signal at the port 32, due to cancellation of noise signals of frequencies which are such that the signals appear in antiphase at the port.

In a conventional distributed amplifier the noise sources which contribute to the noise figure are, apart from the source resistance at the standard temperature:
  (a) the gate line idle termination;
  (b) the drain line idle termination;
  (c) the gate noise generator associated with the or each MESFET; and,
  (d) the drain noise generator associated with the or each MESFET.

In the distributed amplifier in accordance with the present invention the gate line idle termination and the drain line idle termination can vanish and are replaced respectively by the isolated ports 25 and 30 of the hybrid 18 and 26. However, it can be shown that the noise from the isolated port 25 of the hybrid 18 is dissipated in the isolated port termination 30 of the hybrid 26. Furthermore, no noise from the isolated port 30 termination of the hybrid 26 is dissipated in the drain line hybrid output port 31. Thus, in the distributed amplifier in accordance with this invention the contribution to the noise figure of the first two noise sources is the list above vanishes. Additionally, as the gain of the distributed amplifier in accordance with this invention is higher than its conventional equivalent so the noise figure is further reduced.

A brief theoretical analysis of the increase in gain and reduction in noise figure follows. An analysis of the configuration of a conventional distributed amplifier such as shown in FIG. 1 shows the expressions for forward current gain through the drain load ($I_{df}$) and reverse current drain through the drain load ($I_{dr}$) are given by:

$$I_{df} = \tfrac{1}{2} V_{in} g_m\, e^{-j\frac{(n-1)}{2}(\beta_g+\beta_d)} \times \left( \frac{\sin \tfrac{1}{2} n (\beta_g - \beta_d)}{\sin \tfrac{1}{2} (\beta_g - \beta_d)} \right) \text{ and}$$

$$I_{dr} = \tfrac{1}{2} V_{in} g_m\, e^{-j\frac{(n-1)}{2}(\beta_g+\beta_d)} \times \left( \frac{\sin \tfrac{1}{2} n (\beta_g + \beta_d)}{\sin \tfrac{1}{2} (\beta_g + \beta_d)} \right)$$

where V is the voltage at the input $g_m$ is the mutual conductance n is the number of MESFETS in the distributed amplifier and $\beta$ is the gate or drain line phase constant The above equations simplify when $\beta_g = \beta_d$ to give:

$$I_{df} = \tfrac{1}{2} V_{in} n g_m\, e^{-j(n-1)\beta}$$

$$I_{dr} = \tfrac{1}{2} V_{in} g_m\, e^{-j(n-1)\beta} \times \left( \frac{\sin n\beta}{\sin \beta} \right)$$

This illustrates that the forward and reverse current through the drain load are always in phase but change sign when $\sin n\beta / \sin \beta$ changes sign.

These expressions can be used to calculate the total available gain, $G_{f+r}$ in the distributed amplifier configuration in accordance with this invention using 180° hybrids:

$$G_{f+r} = \frac{n^2 g_m^2 Z_{\pi d} Z_{\pi g}}{4} \left( 1 + \frac{\sin n\beta}{n \sin \beta} \right)^2$$

where $Z_{\pi g}$ and $Z_{\pi d}$ are the gate and drain impendances.

It has been shown in the article published by the present inventor in IEEE transactions mentioned earlier that the corresponding forward gain of a conventional distributed amplifier is given by:

$$G_f = \frac{n^2 g_m^2 Z_{\pi d} Z_{\pi g}}{4}$$

Comparing the above two equations it is clear that the distributed amplifier in accordance with this invention has a 6 dB increase in available power gain compared with the conventional amplifier either when $\beta$ is sufficiently small or, alternatively, when n is one.

It is convenient to compare the theoretical noise figure for the distributed amplifier in accordance with this invention and conventional amplifier configurations in the loss-free configurations using the techniques outlined in the article published in IEEE transactions by the present inventor mentioned above. In both configurations the noise figure F can be written as:

$$F = 1 + \frac{\Sigma\, i_g \text{ contributions}}{G_{av}} + \frac{\Sigma\, i_d \text{ contributions}}{G_{av}} + \frac{\text{Gate termination contribution}}{G_{av}} + \frac{\text{Drain termination contribution}}{G_{av}}$$

where $G_{av}$ is the available gain of the distributed amplifier.

It is convenient to tabulate the contribution to the noise figure and these are shown in table 1 below:

TABLE 1

| Noise source | Conventional D.A. | D.A. in accordance with this invention |
|---|---|---|
| MESFET DRAIN | $\dfrac{4P}{ng_m Z_{\pi g}}$ | $\dfrac{8P\, h(r,\beta)}{n^2 g_m Z_{\pi g}\left(1+\dfrac{\sin n\beta}{n\sin\beta}\right)^2}$ |
| MESFET GATE | $\dfrac{Z_{\pi g}\omega^2 C_{gs}R\Sigma\, f(r,\beta)}{n^2 g_m}$ | $\dfrac{Z_{\pi g}\omega^2 C_{gs} R\Sigma\, g(r,\beta)}{2n^2 g_m \left(1+\dfrac{\sin n\beta}{n\sin\beta}\right)^2}$ |
| GATE LOAD | $\left\|\dfrac{\sin n\beta}{n\sin\beta}\right\|^2$ | 0 |
| DRAIN LOAD | $\dfrac{4}{n^2 g_m^2 Z_{\pi g} Z_{\pi d}}$ | 0 | where $C_{gs}$ is the gate-source capacitance, P is the Van der Ziel drain noise constant, and R the Van der Ziel gate noise constant.

Figure 3:
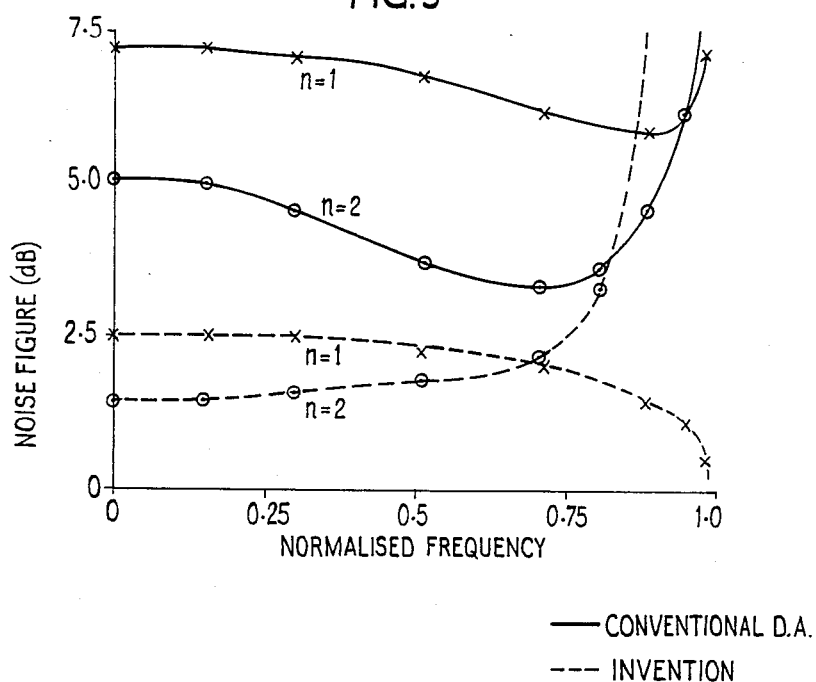
FIG. 3 is a graph of noise figure against normalised frequency to illustrate the comparison of the theoretical noise figure of distributed amplifiers in accordance with the present invention, with those of conventional distributed amplifiers.
Figure 4:
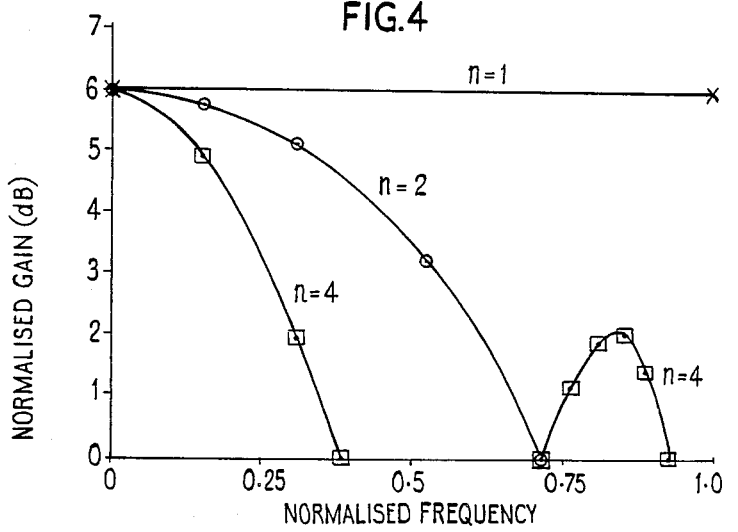
FIG. 4 is a graph of gain against normalised frequency to illustrate the comparison of the theoretical gain of the distributed amplifiers in accordance with this invention with those of conventional amplifiers.

On solving these equations and presenting the results graphically FIGS. 3 and 4 are obtained. FIG. 3 illustrates the theoretical noise figure as a function of the normalised cut off frequencies for a conventional distributed amplifier and for a distributed amplifier in accordance with this invention both including one and two stages, n =1 and 2. It can be seen that there is an improvement close to 5 dB in the noise figure for a single stage distributed amplifier and an improvement of between 2 dB and 3½ dB at frequencies below half the cut off frequency for a two stage distributed amplifier in accordance with this invention. Note that in FIG. 3 response curves of a conventional distributed amplifier as shown in solid lines whilst the response curves for a distributed amplifier in accordance with this invention are shown in dotted lines.

FIG. 4 illustrates the theoretical gain of a distributed amplifier in accordance with this invention normalised to that of a conventional distributed amplifier, the distributed amplifiers including one, two and four MESFETS. This illustrates a 6dB improvement in gain for a one stage distributed amplifier in accordance with this invention and a 6 dB improvement in gain falling to a 0 dB improvement at 70% of the cut-off frequency for a two stage distributed amplifier. It also illustrates a fluctuating improvement for a four stage distributed amplifier.

In an initial practical test of the distributed amplifier in accordance with this invention distributed amplifiers have been manufactured using one and two gallium arsenide MESFETS type NEC 710 manufactured by NEC Semiconductors, of Japan and commercially available broad band 180° hybrid circuits. Similar MESFETS were used to manufacture the conventional single and double stage distributed amplifier circuits used for comparison. The results of practical experiments carried out to determine the noise figure and gain with respect to frequency of these devices are shown in FIGS. 5 to 8.

Figure 5:
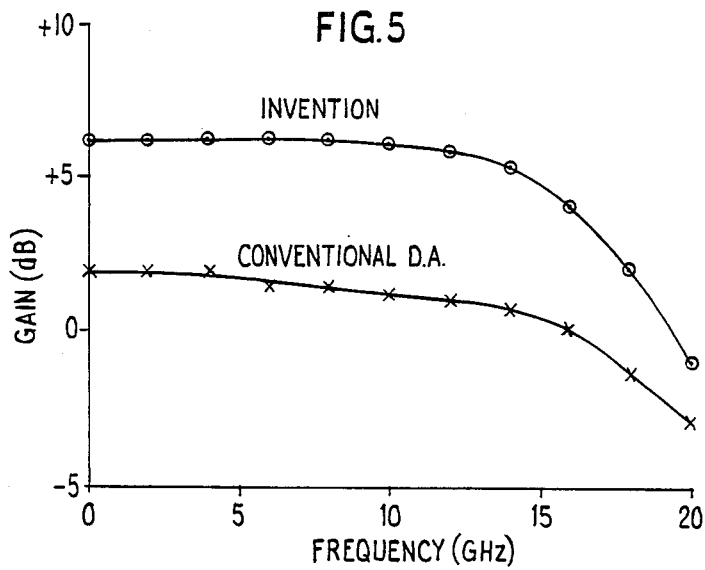
FIG. 5 is a graph of gain against frequency illustrating the comparison of an example of single stage distributed amplifier in accordance with the invention with a conventional device.

FIG. 5 illustrates that an average gain improvement of about 4 dB is achieved compared with the theoretically predicted gain of 6 dB. However, in the case of the distributed amplifier in accordance with the present invention the measured gain includes the loss resulting from the two hybrids 18 and 26 and their associated connectors. In a properly engineered circuit however, a further improvement over the conventional operating mode may be expected to bring the results closer to the theoretically predicted figures. However, the theoretical analysis assumes that the MESFETs and other circuit elements are loss-free and accordingly, the theoretically predicted figures are not attainable in practice.

Figure 6:
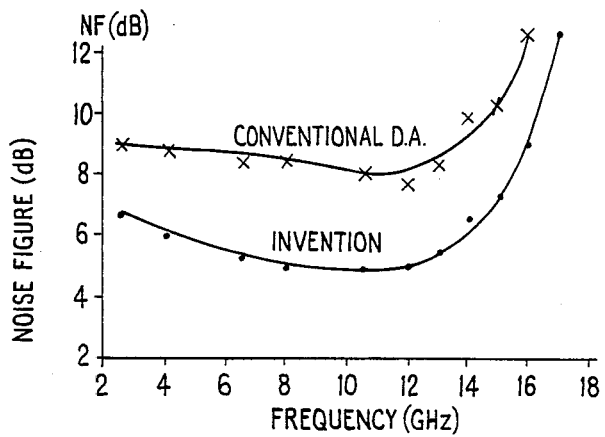
FIG. 6 is a graph of noise figure against frequency illustrating the comparison of an example of single stage amplifier in accordance with this invention with a conventional device.

The comparison of the noise performance of a single stage amplifier is shown in FIG. 6 and illustrates an improvement of approximately 3 dB over the band from 2 to 16 GHz with a noise figure minimum for the distributed amplifier in accordance with this invention of 5 dB. Again this figure has not been corrected for hybrid or connector losses.

The gain and noise figure performance of two stage distributed amplifiers is shown in FIGS. 7 and 8. FIG. 7 illustrates the expected improvements in gain at the lower end of the frequency band and a gain benefit of up to 70% of the cut-off frequency with the distributed amplifier in accordance with this invention in agreement with the theory outlined above. A noise figure comparison showed a noise figure improvement of 2 dB at the low frequency at the end of the band which diminishes until at about 8 GHz the gains become equal. Again it should be noted that the measured noise and gain figures include the losses of the hybrids and the interconnections. These are typically 0.2 dB at 2 GHz rising to 1 dB at 15 GHz.

These experimental results prove that a distributed amplifier in accordance with this invention gives useful improvements in gain and a reduction in the noise figure for amplifiers containing a small number of MESFETs and illustrate, in particular, that the gain and noise figure obtainable from a single stage distributed amplifier in accordance with this invention is generally similar to that obtained from a conventional distributed amplifier including four MESFETs.

I claim:

1. A method of operating a MESFET distributed amplifier, said distributed amplifier including at least one MESFET having a gate and drain, a gate transmission line connected to the gate of said at least one MESFET and having first and second ends, and a drain transmission line connected to the drain of said at least one MESFET and having first and second ends, said method of operating comprising:

feeding a first input signal of said first end of said gate transmission line of said MESFET distributed amplifier;

feeding a second input signal to said second end of said gate transmission line, said second input signal being substantially identical to said first input signal;

taking a first output signal from said first end of said drain transmission line of said MESFET distributed amplifier;

taking a second output signal from said second end of said drain transmission line; and, combining said first said second output signals to produce an amplified output signal.

2. The method of claim 1, wherein said first and said second input signals are in-phase, said method further comprising maintaining the phase states of said first and second output signals relative to one another during said combining of said first and second output signals.

3. The method of claim 2, wherein said distributed amplifier has a cut-off frequency, said method further comprising operating the distributed amplifier at a frequency below 75% of its cut-off frequency.

4. The method of claim 2, wherein said distributed amplifier has a cut-off frequency said method further comprising operating said distributed amplifier at a frequency below 40% of its cut-off frequency.

5. The method of claim 2, wherein said first and said second input signals are phase-shifted relative to one another, said method further comprising imposing a corresponding phase shift on said first and second output signals during said combining of said first and second output signals.

6. The method of claim 5, further comprising phase shifting said first and second input and output signals are phase shifted relative to one another by 90° multiplied by n, wherein n is 1, 2 or 3.

7. The method of claim 5, wherein said distributed amplifier has a cut-off frequency, said method further comprising operating said distributed amplifier at a frequency below 75% of its cut-off frequency.

8. The method of claim 5, wherein said distributed amplifier has a cut-off frequency, said method further comprising operating said distributed amplifier at a frequency below 40% of its cut-off frequency.

9. A wide band amplifier circuit comprising:
   a MESFET distributed amplifier comprising at least one MESFET having a gate and a drain;
   a gate transmission line connected to said gate of said at least one MESFET and having first and second ends; and
   a drain transmission line connected to the drain of said at least one MESFET and having first and second ends; and
   input means, operatively coupled to said first and said second end of said gate transmission line, for applying a first input signal to said first end of said gate transmission line and for applying a second input signal substantially identical to said first input signal to said second end of said gate transmission line; and,
   output means, operatively coupled to said first and said second end of said drain transmission line, for receiving a first output signal from said first end of said drain transmission line and a second output signal from said second end of said drain transmission line and for combining said first and second output signals to provide an amplified output signal.

10. The wide band amplifier of claim 9, wherein said input means and said output means comprise corresponding hybrid circuits.

11. The wide band amplifier of claim 10, wherein said hybrid circuits are connected whereby said first and second input signals are in-phase and impose no phase-shift on said first and second output signals.

12. The wide band amplifier of claim 11, wherein said hybrid circuits are one of 90° and 180° hybrids.

13. The wide band amplifier of claim 12, wherein said distributed amplifier includes only a single MESFET.

14. The wide band amplifier of claim 12, wherein said distributed amplifier includes two MESFETs.

15. The wide band amplifier of claim 13, wherein said MESFETs are GaAs MESFETs.

16. The wide band amplifier of claim 14, wherein said MESFETs are GaAs MESFETs.

17. The wide band amplifier of claim 10, wherein said hybrid circuits are connected whereby said first and second input signals are phase-shifted with respect to one another to a predetermined extent and whereby said first and second output signals are also phase-shifted with respect to one another to a corresponding predetermined extent.

18. The wide band amplifier of claim 17, wherein said hybrid circuits are one of 90° and 180° hybrids.

19. The wide band amplifier of claim 18, wherein said distributed amplifier includes only a single MESFET.

20. The wide band amplifier of claim 18, wherein said distributed amplifier includes two MESFETs.

21. The wide band amplifier of claim 19, wherein said MESFETs are GaAs MESFETs.

22. The wide band amplifier of claim 20, wherein said MESFETs are GaAs MESFETs.

* * * * *